United States Patent
Wang et al.

(10) Patent No.: US 7,026,847 B2
(45) Date of Patent: Apr. 11, 2006

(54) PROGRAMMABLE CURRENT BOOSTER FOR FASTER EDGE-RATE OUTPUT IN HIGH SPEED APPLICATIONS

(75) Inventors: Bonnie I. Wang, Cupertino, CA (US); Chiakang Sung, Milpitas, CA (US); Khai Q. Nguyen, San Jose, CA (US); Xiaobao Wang, Cupertino, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/749,883

(22) Filed: Dec. 31, 2003

(65) Prior Publication Data

US 2005/0140430 A1   Jun. 30, 2005

(51) Int. Cl.
*H03K 3/00* (2006.01)
(52) U.S. Cl. .................................. 327/112; 327/170
(58) Field of Classification Search ................ 327/112, 327/170, 437, 438; 326/86
See application file for complete search history.

(56) References Cited

U.S. PATENT DOCUMENTS

| | | | |
|---|---|---|---|
| 4,820,942 A * | 4/1989 | Chan | 327/310 |
| 4,975,598 A * | 12/1990 | Borkar | 326/32 |
| 5,438,550 A * | 8/1995 | Kim | 365/233.5 |
| 6,222,403 B1 * | 4/2001 | Mitsuda | 327/170 |
| 6,300,799 B1 * | 10/2001 | Nakamura | 326/86 |
| 6,504,396 B1 * | 1/2003 | Sher et al. | 326/21 |
| 6,633,178 B1 * | 10/2003 | Wilcox et al. | 326/30 |
| 6,842,058 B1 * | 1/2005 | McNitt et al. | 327/170 |
| 2003/0090308 A1 * | 5/2003 | Huynh et al. | 327/227 |

* cited by examiner

*Primary Examiner*—Terry D. Cunningham

(57) ABSTRACT

An AC current booster for high speed, high frequency applications having a single-ended output embodiment and a differential output embodiment. The embodiments of the present invention allow bifurcated control of the AC switching rate and the DC state of a given output signal, in order to achieve faster rising and falling edge rates without an undesirable increase in output voltage swing.

27 Claims, 7 Drawing Sheets

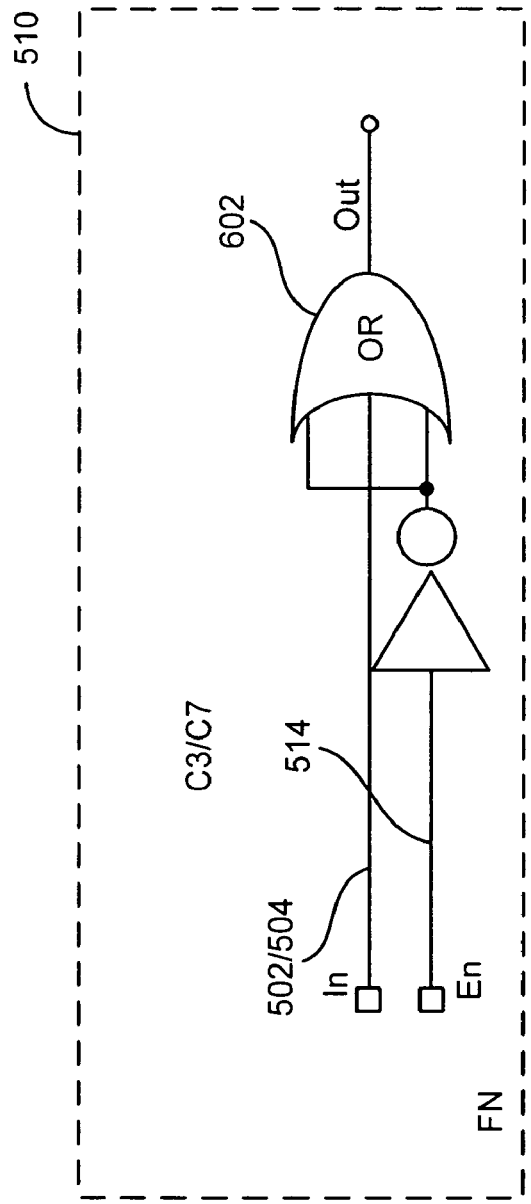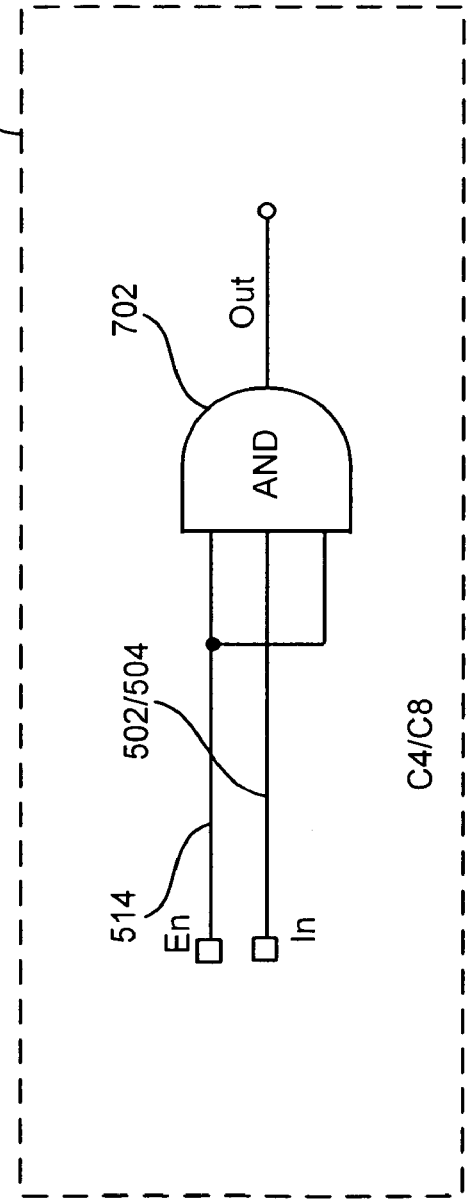
Fig. 4
Fig. 5

US 7,026,847 B2

PROGRAMMABLE CURRENT BOOSTER FOR FASTER EDGE-RATE OUTPUT IN HIGH SPEED APPLICATIONS

FIELD OF THE INVENTION

Embodiments of the present invention relate to achieving faster output signal edge rates in high frequency signaling for programmable logic devices (PLDs) and other integrated circuits (ICs), most particularly to signals which may be designed to conform to any one of several different high frequency input/output (I/O) signaling standards.

BACKGROUND OF THE INVENTION

Programmable logic devices (PLDs) are well known. Commonly, a PLD has a plurality of substantially identical logic elements, each of which can be programmed to perform certain desired logic functions. The logic elements have access to a programmable interconnect structure that allows a user to interconnect the various logic elements in almost any desired configuration. The interconnect structure also provides access to a plurality of I/O pins, with the connections of the pins to the interconnect structure also being programmable and being made through suitable I/O buffer or driver circuitry. The PLD may be field programmable or programmable, either wholly or partially, in any other manner. It may be one-time only programmable, or it may be reprogrammable. The term PLD as used herein will be considered broad enough to include all such devices.

As user applications incorporating PLDs evolve to operate at yet higher and higher speeds, and higher frequency signaling standards evolve to support those requirements, it is desirable that the I/O capability of PLDs keep pace with these developments.

In order to achieve successful operation in circuits operating at high speeds, typically greater than 200 Mhz at present, existing I/O signaling standards require a signal waveform having fast edge rate and small output voltage swing, in order to maintain precise phase relationships between the high frequency signals. These two crucial requirements, fast edge rate and small output voltage swing, are physical characteristics inherently in opposition with each other. Overdriving for a faster edge rate directly results in increased output voltage swing. It is therefore becoming increasingly difficult to meet both requirements when the same output current settings are used for both switching and holding states as circuit speeds continue to increase.

SUMMARY OF THE INVENTION

A switching current booster is described herein capable of operating at high frequencies for high speed applications and is described in several embodiments including a single-ended output circuit and a differential output circuit. Although the signal frequencies are typically around 200 MHz in one embodiment, the present invention may be equally applicable to circuit speeds that are lower or higher. Embodiments of the present invention can be programmed to provide any specific combination of output current, capacitive loading, output voltage swing and signal edge rate (typically in the order of 100 picoseconds) in order to conform to any one of several well known I/O signaling standards.

Some examples of commonly known I/O standards which use single-ended signaling circuits include High Speed Transceiver Logic (HSTL) Classes 1 and 2, Series Stub Terminated Logic (SSTL) Classes 1 and 2, and Peripheral Component Interface (PCI). Embodiments of the present invention are compatible with these examples.

Other commonly known I/O standards which use differential signaling circuits include Low Voltage Differential Signaling (LVDS), HyperTransport (HT), and Low-Voltage Positive Emitter-Coupled Logic (LVPECL). Embodiments of the present invention are compatible with these examples.

Embodiments of the present invention allow for bifurcated control of the switching rate and the holding state of a given output signal, in order to achieve faster rising and falling edge rates without the undesirable increased output voltage swing. Fast edge rates require a large switching current to charge up the capacitive loading, while providing a small holding current to limit the output voltage swing. The programmable current booster described here provides a separate switching current during the output switching phase, while not affecting the holding current or the output voltage swing. Importantly, the strength and the duration of the switching booster current are programmable to allow a user the maximum flexibility in conforming to any of the I/O signaling standards such as HSTL, SSTL, LVDS, LVPECL or HyperTransport, though the present invention is not limited to only those standards. Embodiments of the present invention may be equally applicable to other relevant existing standards as well as those standards which have yet to be proposed or fully developed.

Though not limited to implementation in PLDs, the embodiments of the present invention are particularly suited to PLD output drivers and output drivers for other programmable ICs. These devices tend to have more demanding I/O requirements as they are very commonly deployed in interfacing with many varied signaling standards.

BRIEF DESCRIPTION OF THE DRAWINGS

FIG. 4 shows exemplary details of the differential holding stage rising edge control circuit.

FIG. 5 shows exemplary details of the differential holding stage falling edge control circuit.

DETAILED DESCRIPTION OF THE INVENTION

The term "rising edge" used in describing the embodiments of the present invention refers to the rising edge of the signal waveform as the signal voltage level transitions from a LOW to a HIGH state. Similarly, the term "falling edge" refers to the falling edge of the signal waveform as the signal voltage level transitions from a HIGH to a LOW state.

Single-Ended Embodiment

Figure 1:
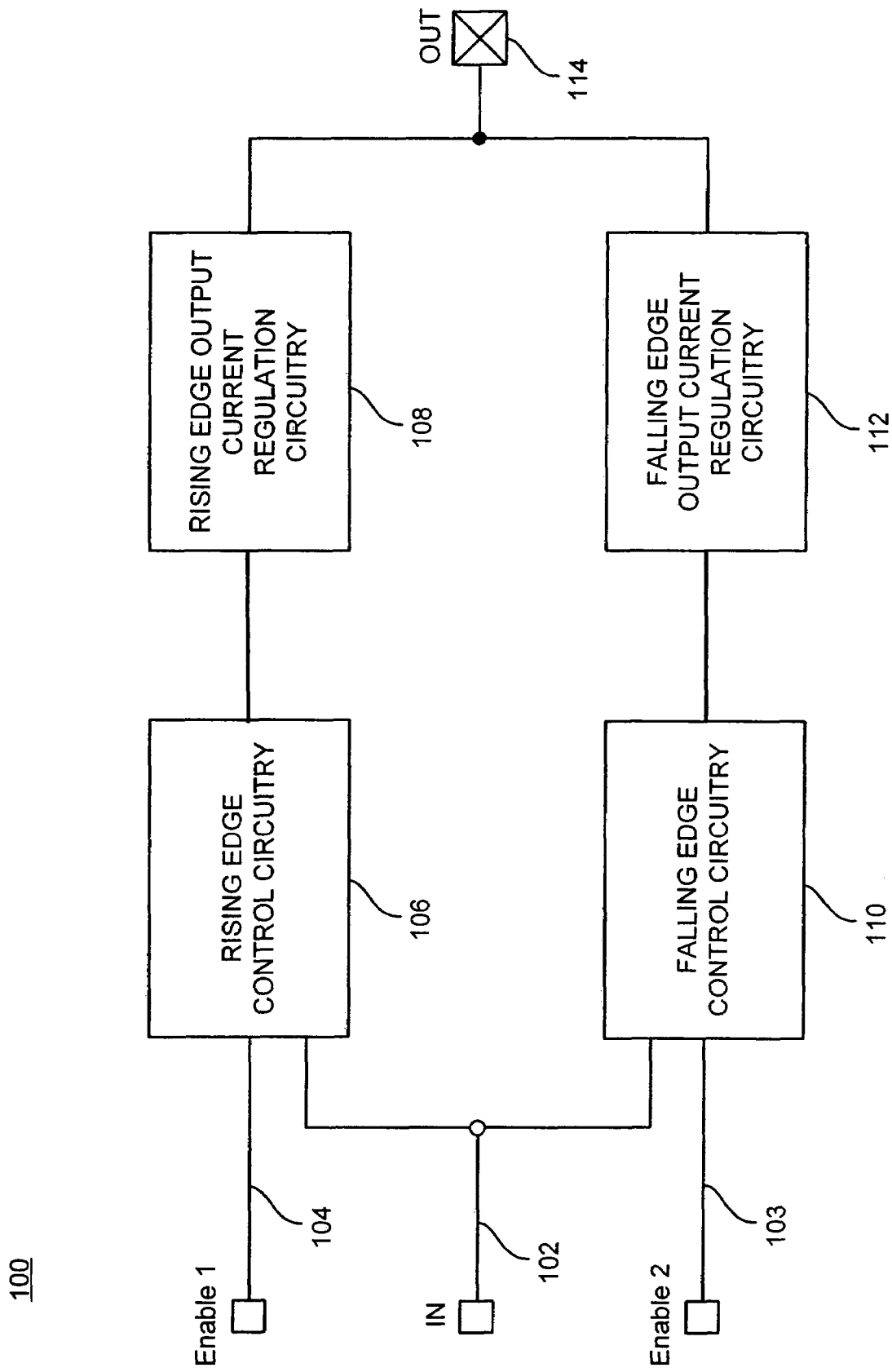
FIG. 1 is a block diagram of an exemplary programmable current booster according to one embodiment of the present invention as applied to a single-ended output driver.

FIG. 1 is a block diagram of the programmable current booster 100 according to one embodiment of the present invention as applied to a single-ended output driver. During configuration of the PLD, configuration signals 103 and 104 ("enable signals") which originate from the PLD and are applied to the rising and falling edge control circuits 106 and 110 respectively. Bifurcated control of the rising edge of the single-ended output signal is applied via rising edge control circuitry 106 and rising edge output current control circuitry 108.

Similarly, the falling edge characteristics are conditioned and controlled via falling edge control circuitry 110 and a falling edge output current regulation circuitry 112 of FIG. 1. The rising edge and falling edge control circuitry have a common input or data signal 102 which typically originates from the core of the PLD. The separately conditioned rising and falling edge characteristics of the input signal are eventually incorporated into a single signal output 114.

Figure 2A:
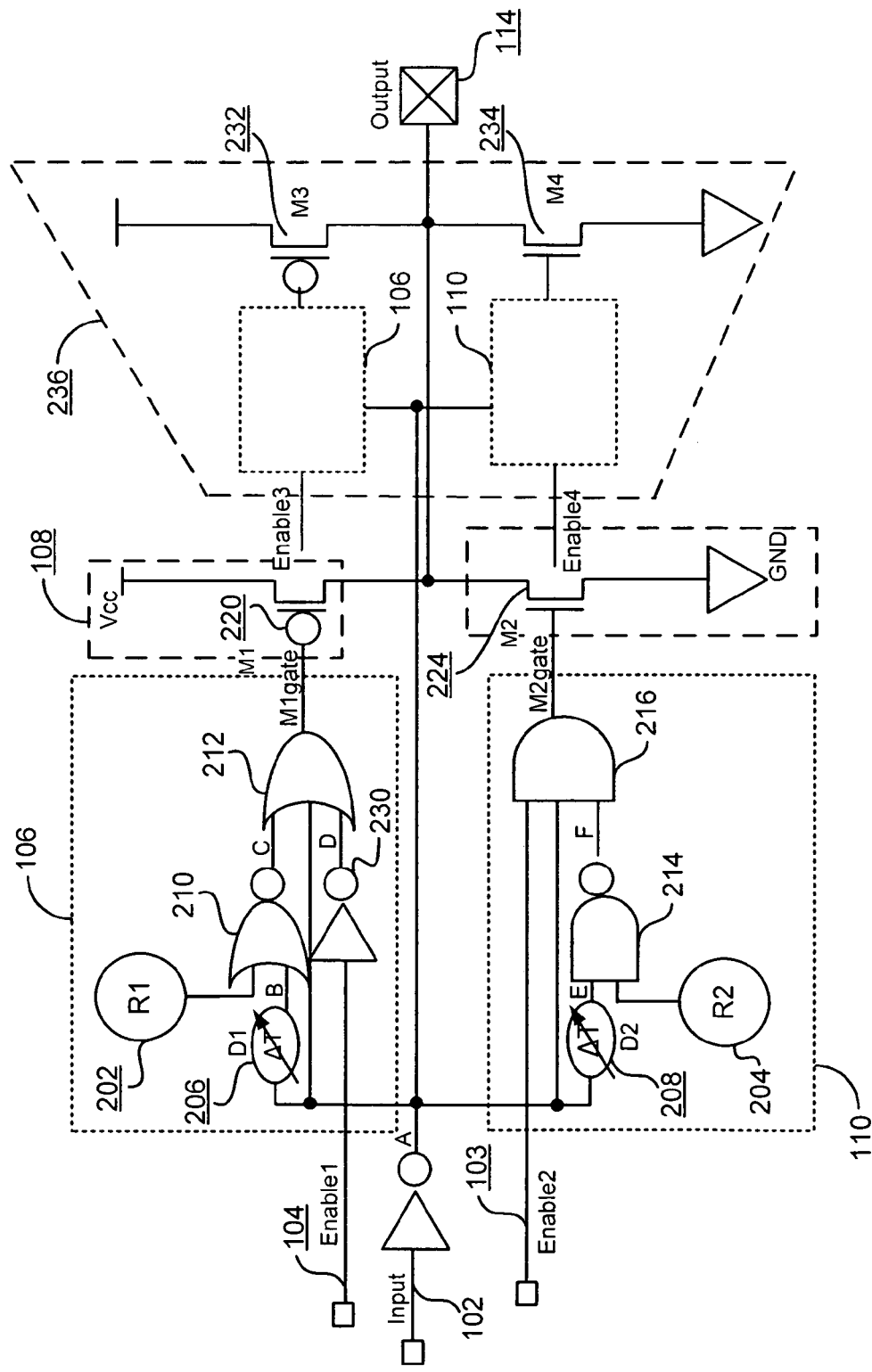
FIG. 2A is a preferred implementation of the single-ended output driver according to an embodiment of the present invention.

FIG. 2A illustrates an exemplary circuit diagram of the embodiment 100 of the present invention depicted in the block diagram of FIG. 1, and represents a preferred implementation of a single-ended output driver circuit. Single-ended drivers are used in the implementation of single-ended signals, e.g., signals that are referenced to ground.

Output transistors 220 and 224 are used to regulate the magnitude of the switching current and holding current. Transistor 220 is controlled by the output of OR gate 212. Transistor 224 is controlled by the output of AND gate 216. The duration of the current flowing through the output transistors is programmable via the rising edge control circuit 106 and falling edge control circuit 110.

Common input signal 102 is typically inverted as applied to all circuits depicted in FIG. 2A. A configuration bit 202 controls operation of rising edge circuit 106. The configuration bit may be a RAM bit, but may also be implemented via one-time programmable device arrangements such as those based on programmable logic elements made from fuses or antifuses, or may be implemented via SRAM, DRAM, EPROM, EEPROM, MRAM or the like.

If configuration signal 104 is LOW, output transistor 220 is always off. When configuration signal 104 is HIGH, output transistor 220 is enabled, but the duration of its ON state is programmable in two ways. First, if RAM bit 202 is programmed to be HIGH, then output transistor 220 will remain ON as long as common input signal 102 is HIGH, thereby providing a continuous holding output current which would contribute to the output voltage swing. Second, if RAM bit 202 is configured to be LOW, then output transistor 220 will be ON only during the edge transition time when input signal 102 is switching from LOW to HIGH. The duration of this ON time is programmable via programmable delay element 206. This short period of current through output transistor 220 will charge up the loading on output pin 114, and reduce the rise time, but will not affect the holding output voltage swing.

Similarly, output transistor 224 can be totally disabled when configuration signal 103 is LOW, or can be programmed to be ON as long as common input signal 102 is low, or can even be programmed to be ON only when common input signal 102 is switching from HIGH to LOW, thereby providing a holding output current. Configuration bit 204 controls operation of falling edge circuit 110. Programmable delay element 208 is similarly used to control the ON duration of output transistor 224.

Rising edge output transistor 220 is most efficiently implemented using PMOS construction in one embodiment, though it is not limited to such. On the other hand, inherent NMOS transistor characteristics favor their use in falling edge output transistor 224.

Additional parallel-coupled sets of control circuits can be connected in the cascaded manner shown for at least a second set of rising and falling edge circuitry 236, each such output set having varying channel width, thereby allowing users to program them into various combinations of holding and switching current paths. To control the strength of the current for the output signal 114, several output transistors may be connected in parallel. In this case, pull-up output transistors 220 and 232 are shown connected in parallel, and so are pull-down output transistors 224 and 234. At least one of pull-up output transistors 220 and 232 and one of pull-down output transistors 224 and 234 should be programmed to provide holding current. In this manner, users can select different strengths for the holding and switching currents separately, thereby achieving a fast edge rate with a relatively small output voltage swing.

Figure 2B:
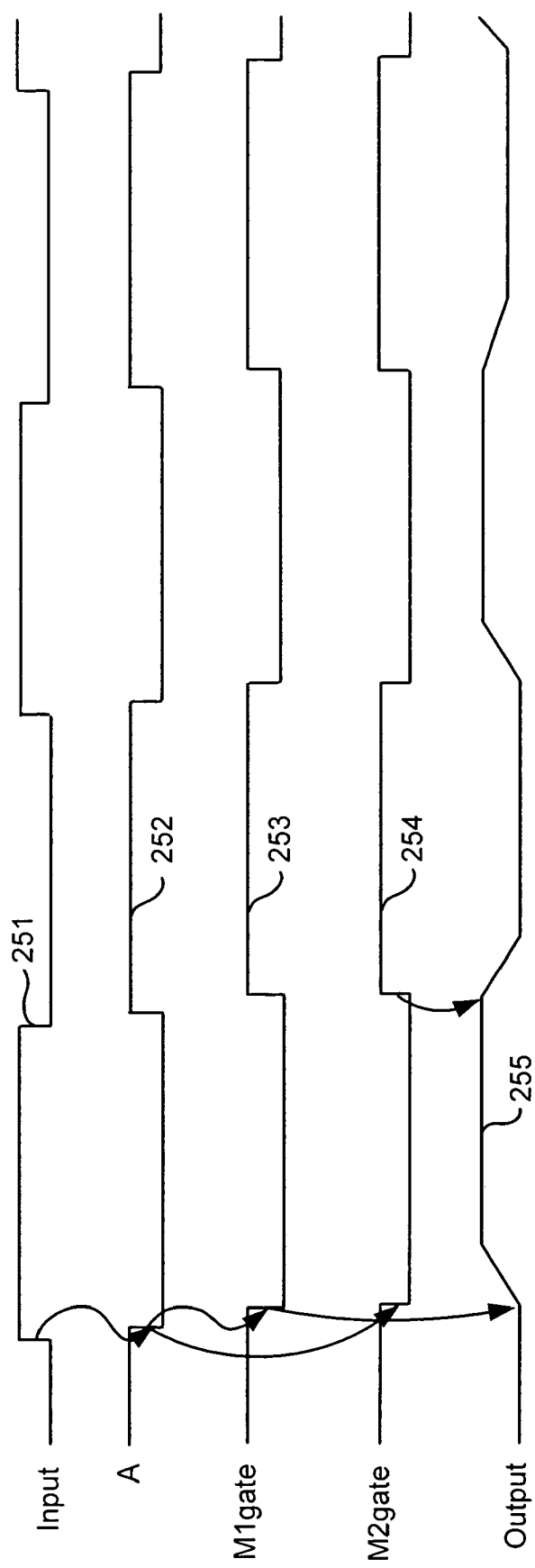
FIG. 2B illustrates a timing diagram of the single-ended output driver operation in the case with the holding output enabled.

FIG. 2B is a timing diagram for an exemplary operational case of the circuit 100 of FIG. 2A. Refer to both FIG. 2A and FIG. 2B, In this exemplary case, the holding output is enabled. In this case, the configuration bit 202 (FIG. 2A) is high; configuration bit 204 is low; enable 104 is high; enable 103 is high; the C and D inputs of OR gate 212 are low and the F input of AND gate 216 is high. Waveform 251 represents transitions on the input 102. Waveform 252 represents transitions on the output of the inverter circuit coupled to receive input 102. Waveform 253 represents transitions on the input to output transistor 220. Waveform 254 represents transitions on the output transistor 224. Waveform 255 represents transitions on the output 114.

The falling edge of 252 causes the falling edge of both 253 and 254. The falling edge of 253 starts the rising edge of output data signal 255 and the rising edge of 254 starts the falling edge of output data signal 255.

According to this operational mode, if configuration bit 202 is programmed high, then transistor 220 will be on as long as the input signal 102 is high, providing a continuous output current which would contribute to the holding output voltage swing.

Figure 2C:
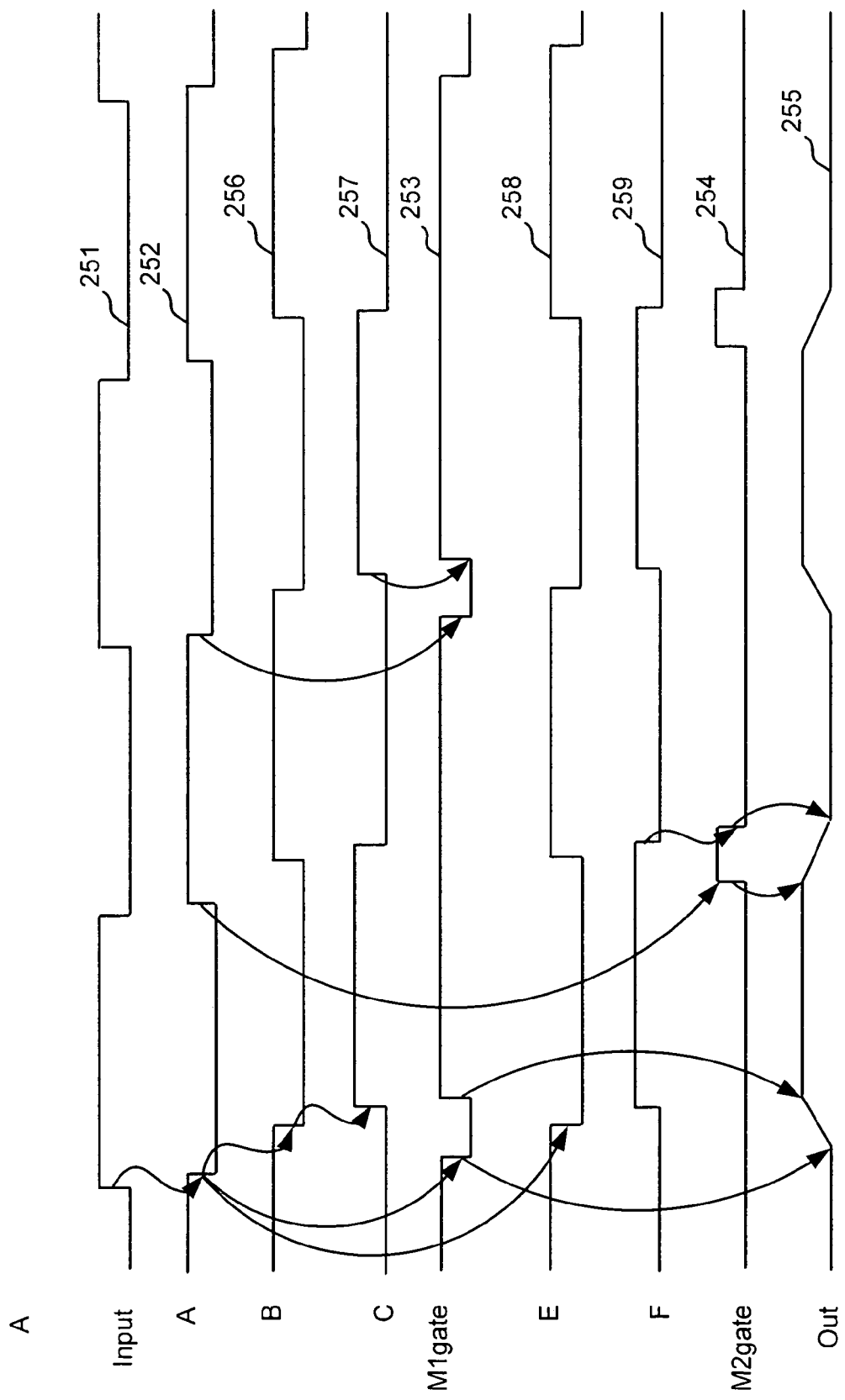
FIG. 2C illustrates a timing diagram of the single-ended output driver operation in the case with the switching current booster enabled.

FIG. 2C is a timing diagram of the switching booster control rising edge circuit 106 for an exemplary operational case of the circuit 100 of FIG. 2A. Refer to both FIG. 2A and FIG. 2C. In this exemplary case, the switching booster control circuit 106 is enabled while output transistors 232 and 234 are programmed to provide holding output current. In this case, the configuration bit 202 (FIG. 2A) is low; configuration bit 204 is high; enable 104 is high; enable 103 is high; and the D input of OR gate 212 is low. Waveform 256 represents input B of NOR gate 210. Waveform 257 represents input C of OR gate 212. Waveform 258 represents input E of NAND gate 214. Waveform 259 represents input F of AND gate 216. Waveforms 251–255 are analogous to those circuit points as described with reference to FIG. 2B.

In operation, if bit 202 is low, then transistor 220 will be ON only during the transition time when the input 102 is switching from low to high; the duration of this ON time can be programmed by the programmable delay element 206. This short period of current through transistor 220 will charge up the loading on the output pin and reduce the rise time, but will not generally affect the holding output voltage swing.

Similarly, transistor 224 can be totally disabled when enable 103 is low, or programmed to provide a holding output current if enable 103 is high and 204 is low, or further, programmed to be ON only when the input is switching from high to low. The programmable delay 208 controls the duration of the ON state.

Differential Embodiment

The programmable current booster according to the embodiment of the present invention described above for a single-ended output driver may also be applied in a differential output driver. Differential drivers are used to implement differential signals which are carried on pairs of conductors in which the signals propagate in parallel. Differential signals are opposite in polarity and referenced relative to each other, rather than to ground.

Figure 3:
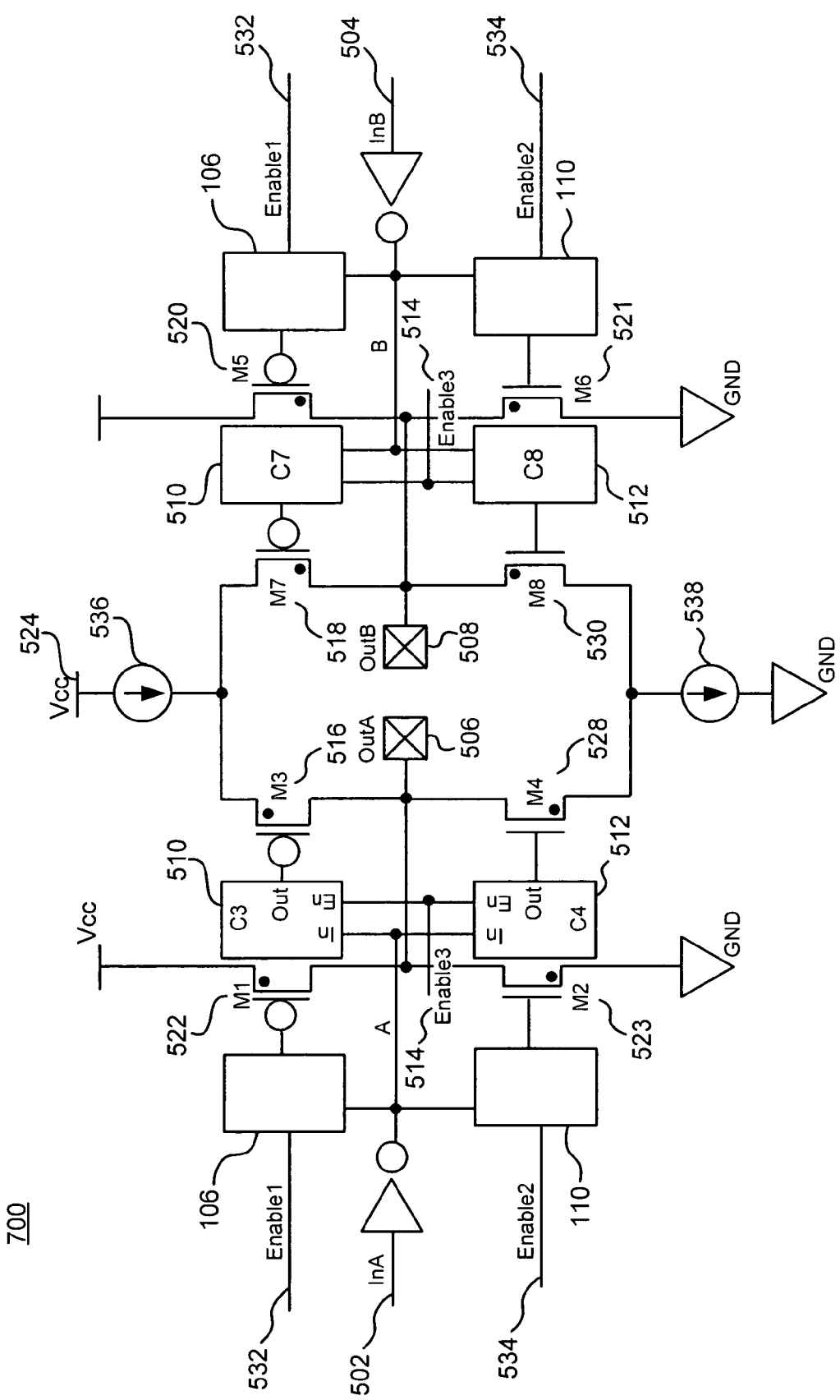
FIG. 3 is a preferred implementation of a differential output driver according to an embodiment of the present invention.

FIG. 3 is a preferred implementation of a differential output driver 700 according to one embodiment of the present invention. Output transistors 516, 518, 528 and 530 provide holding output current, while output transistors 522, 523, 520 and 521 are switching current boosters. holding stage rising edge control circuits 510 have the analogous delay as the switching booster control circuits 106, so the holding and switching currents are switched on simultaneously. The control circuits 106 for current-regulating output transistors 520 and 522 in this differential embodiment are identical to that of circuit 106 for the single-ended case of FIG. 2A. Similarly, control circuits 110 for output transistors 521 and 523 are identical to that of circuit 110 for the single-ended case of FIG. 2A.

The differential output driver of FIG. 3 may optionally use the current and voltage regulating arrangement depicted as voltage source (Vcc) 524 in series with current regulator 536, and current regulator 538 coupled to Ground, for supplying current to differential outputs 506 and 508. This permits the differential output signal to be further conditioned to fall within upper and lower limits of current and voltage in accordance with the applicable differential signaling standard.

FIG. 4 shows exemplary details of a preferred circuit implementation of the differential holding stage rising edge control circuit 510 for the differential embodiment 700 of FIG. 3. The OR gate 602 has a first OR input from the common input or data signal 502/504 received from the integrated circuit device, a second OR input from an input/output configuration signal 514 ("enable signal") received from the integrated circuit device and inverted via an inverter circuit, and a third OR input coupled to the second OR input (e.g., also from the output of the inverter circuit). Output transistor 516/518 of FIG. 3 is coupled to the output of OR gate 602.

In operation of circuit 510, if the enable signal 514 is low, then the output of the OR gate 602 is forced high regardless of the data input pin 502/504 once the inverter signal output becomes stable. If the enable signal 514 is high, then the output of the OR gate 602 will track the data input value 502/504, again, once the output of the inverter is stable.

The holding stage rising edge control circuits 510 should be designed to have the same delay as the rising edge switching booster control circuits 106, so the holding and switching currents are switched on simultaneously. Alternately, rising edge control circuit 106 can be used to control output transistors 516/518, again providing simultaneous switching on for the holding and switching currents.

FIG. 5 shows exemplary details of a preferred circuit implementation of the differential holding stage falling edge control circuit 512 for the differential embodiment 700 of FIG. 3. The AND gate 702 is coupled to receive a first AND input from the common input signal 502/504 received from the integrated circuit device, a second AND input from an input/output configuration signal 514 ("enable signal") received from the integrated circuit device, and a third AND input coupled to the second AND input. Output transistor 528/530 are coupled to receive the output of AND gate 702.

In operation of circuit 512, if the enable signal 514 is low, then the output of the AND gate 702 is forced low regardless of the data input pin pair 502/504. If the enable signal 514 is high, then the output of the AND gate 702 will track the data input value 502/504.

The holding stage falling edge control circuit 512 should be designed to have the same delay as the switching booster control circuits 110, so the holding and switching currents are switched on simultaneously. Or alternately, falling edge control circuit 110 can be used to control output transistors 528 and 530, whereby the holding and switching currents will be switched on simultaneously.

Figure 6:
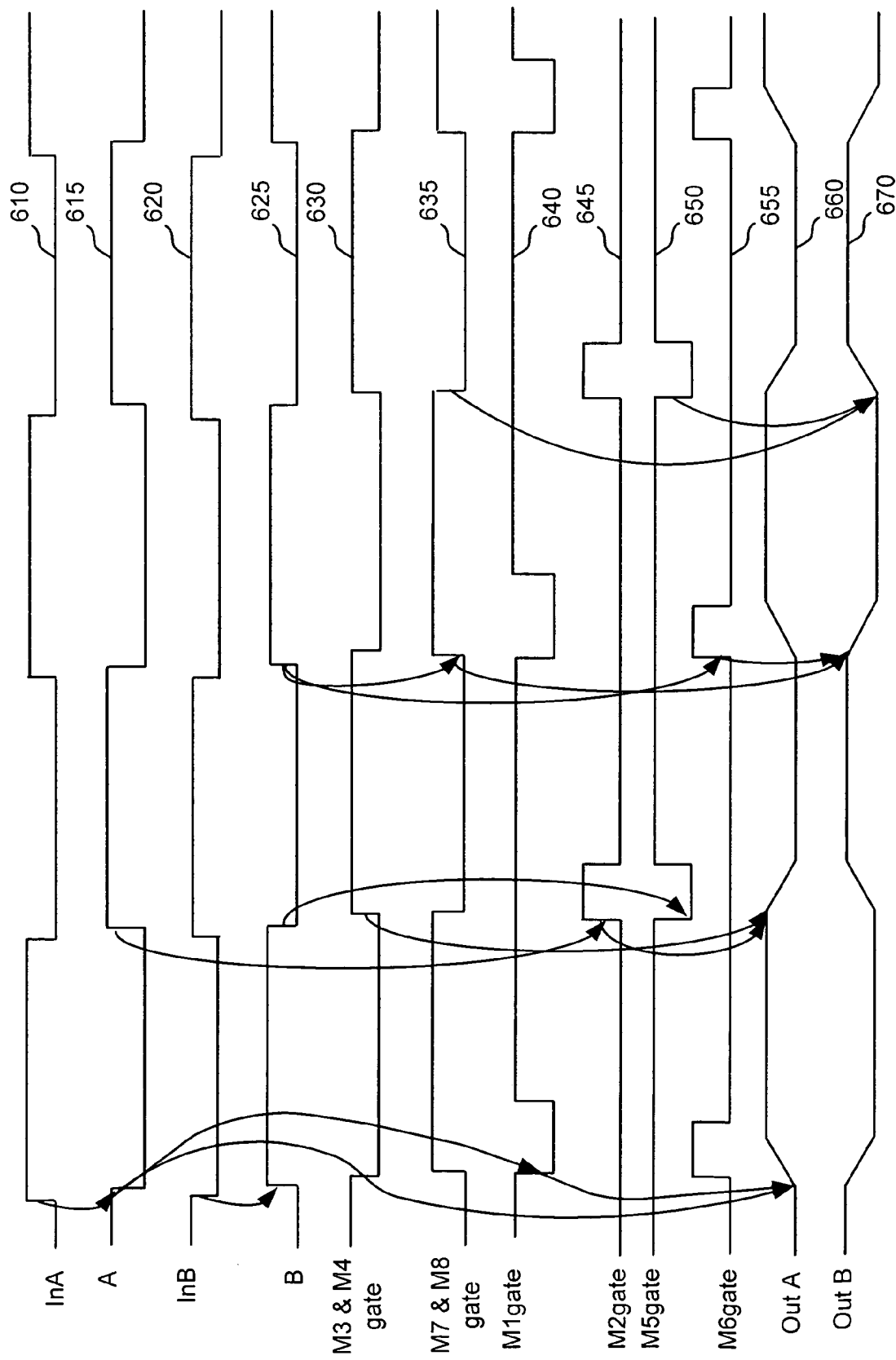
FIG. 6 illustrates a timing diagram of the differential output driver operation.

FIG. 6 is a timing diagram for an exemplary operational case of the circuit 700 of FIG. 3. Refer to both FIG. 3 and FIG. 6. In this case, enable 532, enable 534 and enable 514 are all high; input 202 (of switching booster control block 106) is low and configuration bit 204 (of falling edge control block 110) is high. Waveform 610 represents input 502. Waveform 615 represents the output of the inverter that receives input 502. Waveform 620 represents input 504. Waveform 625 represents the output of the inverter that receives input 504. Waveform 630 represents the gate signal at output transistors 516 and 528. Waveform 635 represents the gate signal at output transistors 518 and 530. Waveform 640 represents the gate signal for transistor 522. Waveform 645 represents the gate signal for transistor 523. Waveform 650 represents the gate signal for transistor 520. Waveform 655 represents the gate signal for transistor 521. Waveforms 660 and 665 represent the differential output signals 506 and 508, respectively.

In operation, output transistors 516, 528, 518 and 530 provide holding output current, while transistors 522, 523, 520 and 521 are switching current boosters. The control circuits 510 and 512 for the holding output transistors are designed to have the same delay as the switching booster control circuits 106 and 110, so the holding current and switching current will be switched on at the same time.

While specific circuits have been used to describe the present invention, the idea of using a programmable current booster in an integrated circuit output driver, with programmable duration and programmable strength of the switching booster current may be implemented using other circuit embodiments. It is intended that the invention not be limited to the particular embodiments disclosed, but that the invention will include all embodiments and all equivalents falling within the scope of the claims.

What is claimed is:

1. A programmable current booster circuit for an integrated circuit device comprising:
    a first rising edge control circuit, wherein the first rising edge control circuit comprises
        a first inverter gate coupled to receive an input/output configuration signal from the integrated circuit device,
        a NOR gate coupled to receive a first NOR input from an input/output configuration signal from the integrated circuit device,
        an OR gate coupled to receive a first OR input from the first inverter gate, a second OR input from the NOR gate and a third OR input from the common input signal, and
        a first programmable delay element having an input from the common input signal, the output of the first programmable delay element being coupled to a second NOR input of the NOR gate;
    a first falling edge control circuit, wherein inputs of the first rising and first falling edge control circuits are coupled to a common input signal, and wherein the first rising edge and first falling edge control circuits are controlled based on input/output configuration signals from the integrated circuit device;
    a first rising edge output current regulation circuit coupled to the output of the first rising edge control circuit; and
    a first falling edge output current regulation circuit coupled to the output of the first falling edge control circuit, wherein outputs of the first rising edge output current regulation circuit and the first falling edge output current regulation circuit are coupled to provide a unified output signal.

2. The programmable current booster of claim 1 further comprising:
    at least a second rising edge control circuit;
    at least a second falling edge control circuit, wherein the inputs of the at least a second rising and at least a second falling edge control circuits are coupled to the common input signal, and the at least a second rising edge and the at least a second falling edge control circuits are configurable based on input/output configuration signals received from the integrated circuit device;
    at least a second rising edge output current regulation circuit coupled to the output of the at least a second rising edge control circuit; and
    at least a second falling edge output current regulation circuit coupled to the output of the at least a second falling edge control circuit;
    wherein the first rising edge and first falling edge output current regulation circuits are coupled in parallel with the at least a second rising edge and the at least a second falling edge output current regulation circuits respectively, and the output of the circuits coupled in parallel are coupled to the unified output signal.

3. The programmable current booster of claim 1 wherein the first rising edge output current regulation circuit comprises at least one PMOS transistor.

4. The programmable current booster of claim 1 wherein the first falling edge output current regulation circuit comprises at least one NMOS transistor.

5. The programmable current booster of claim 1 wherein the first rising edge output current regulation circuit comprises:
    an output transistor coupled to receive the output of the first rising edge control circuit; and
    a voltage source;
    wherein the source terminal of the output transistor is coupled to the voltage source and the drain of the output transistor is coupled to the first falling edge output current regulation circuit.

6. The programmable current booster of claim 1 wherein the first falling edge output current regulation circuit comprises:
    an output transistor coupled to receive the output of the first falling edge control circuit;
    wherein the drain of the output transistor is coupled to the first rising edge output current regulation circuit and the source terminal of the output transistor is connected to ground.

7. The programmable current booster of claim 1 for use with an output driver of an integrated circuit device wherein the unified output signal conforms to at least one of the HSTL or SSTL signaling standards.

8. A printed circuit board on which is mounted an integrated circuit device comprising a programmable current booster circuit as defined in claim 1.

9. A programmable current booster circuit for an integrated circuit device comprising:
    a first rising edge control circuit,
        a first falling edge control circuit, wherein the first falling edge control circuit comprises
        a NAND gate coupled to receive as a first NAND input an input/output configuration signal from the integrated circuit device,
        a second programmable delay element having an input from the common input signal and having an output coupled to a second NAND input of the NAND gate,
        an AND gate coupled to have a first AND input from the output of the NAND gate, a second AND input coupled to the input of the second programmable delay element, and a third AND input from an input/output configuration signal received from the integrated circuit device, and
    wherein inputs of the first rising and first falling edge control circuits are coupled to a common input signal, and wherein the first rising edge and first falling edge control circuits are controlled based on input/output configuration signals from the integrated circuit device;

a first rising edge output current regulation circuit coupled to the output of the first rising edge control circuit; and a first falling edge output current regulation circuit coupled to the output of the first falling edge control circuit, wherein outputs of the first rising edge output current regulation circuit and the first falling edge output current regulation circuit are coupled to provide a unified output signal.

10. The programmable current booster of claim 9 further comprising:

at least a second rising edge control circuit;

at least a second falling edge control circuit, wherein the inputs of the at least a second rising and at least a second falling edge control circuits are coupled to the common input signal, and the at least a second rising edge and the at least a second falling edge control circuits are configurable based on input/output configuration signals received from the integrated circuit device;

at least a second rising edge output current regulation circuit coupled to the output of the at least a second rising edge control circuit; and at least a second falling edge output current regulation circuit coupled to the output of the at least a second falling edge control circuit;

wherein the first rising edge and first falling edge output current regulation circuits are coupled in parallel with the at least a second rising edge and the at least a second falling edge output current regulation circuits respectively, and the output of the circuits coupled in parallel are coupled to the unified output signal.

11. The programmable current booster of claim 9 wherein the first rising edge output current regulation circuit comprises at least one PMOS transistor.

12. The programmable current booster of claim 9 wherein the first falling edge output current regulation circuit comprises at least one NMOS transistor.

13. The programmable current booster of claim 9 wherein the first rising edge output current regulation circuit comprises:

an output transistor coupled to receive the output of the first rising edge control circuit;

a voltage source;

wherein the source terminal of the output transistor is coupled to the voltage source and the drain of the output transistor is coupled to the first falling edge output current regulation circuit.

14. The programmable current booster of claim 9 wherein the first falling edge output current regulation circuit comprises:

an output transistor coupled to receive the output of the first falling edge control circuit;

wherein the drain of the output transistor is coupled to the first rising edge output current regulation circuit and the source terminal of the output transistor is connected to ground.

15. The programmable current booster of claim 9 for use with an output driver of an integrated circuit device wherein the unified output signal conforms to at least one of the HSTL or SSTL signaling standards.

16. A programmable current booster circuit for use with a differential output driver of an integrated circuit device comprising:

a pair of switching stage rising edge control circuits coupled to receive a pair of differential input signals, wherein the pair of differential input signals differ from one another in voltage in order to represent information in accordance with a differential interface standard;

a pair of switching stage rising edge output current regulation circuits coupled to respective outputs of the switching stage rising edge control circuits;

a pair of holding stage rising edge control circuits coupled to receive the pair of differential input signals;

a pair of switching stage falling edge control circuits coupled to receive the pair of differential input signals;

a pair of switching stage falling edge output current regulation circuits coupled to respective outputs of the pair of switching stage falling edge control circuits; and a pair of holding stage falling edge control circuits coupled to receive the pair of differential input signals;

wherein the pairs of switching and holding stage rising edge and switching and holding falling edge control circuits are configurable based on input/output configuration signals received from the integrated circuit device and the outputs of the respective pairs of switching rising and falling edge output current regulation circuits and the holding stage rising and falling edge control circuits are coupled to provide a pair of differential output signals.

17. The programmable current booster circuit of claim 16 wherein the switching stage rising edge control circuit further comprises:

a first inverter gate coupled to receive an input/output configuration signal from the integrated circuit device;

a NOR gate coupled to receive a first NOR input from an input/output configuration signal from the integrated circuit device;

an OR gate coupled to receive a first OR input from the first inverter gate, a second OR input from the NOR gate and a third OR input from the common input signal received from the integrated circuit device; and a first programmable delay element having an input from the common input signal received from the integrated circuit device, the output of the first programmable delay element being coupled to a second NOR input of the NOR gate.

18. The programmable current booster circuit of claim 16 wherein the holding stage rising edge control circuit further comprises:

an OR gate having a first OR input from the common input signal received from the integrated circuit device, a second OR input from an input/output configuration signal received from the integrated circuit device, and a third OR input coupled to the second OR input;

an output transistor coupled to receive the output of the OR gate, having its drain coupled to a respective one differential output signal, and its source terminal coupled to a voltage source via a current source.

19. The programmable current booster circuit of claim 16 wherein the holding stage rising edge control circuit comprises at least one PMOS transistor.

20. The programmable current booster circuit of claim 16 wherein the switching stage falling edge control circuit further comprises:

a NAND gate coupled to receive as a first NAND input an input/output configuration signal from the integrated circuit device;

a second programmable delay element having an input from the common input signal received from the inte grated circuit device and having an output coupled to a second NAND input of the NAND gate; and an AND gate coupled to have a first AND input from the output of the NAND gate, a second AND input coupled to the input of the second programmable delay element, and a third AND input from an input/output configuration signal received from the integrated circuit device.

21. The programmable current booster circuit of claim 16 wherein the holding stage falling edge control circuit further comprises:

an AND gate coupled to receive a first AND input from the common input signal received from the integrated circuit device, a second AND input from an input/output configuration signal received from the integrated circuit device, and a third AND input coupled to the second AND input; and an output transistor coupled to receive the output of the AND gate, having its drain coupled to a respective one differential output signal and its source terminal coupled to ground via a current source.

22. The programmable current booster circuit of claim 16 wherein the holding stage falling edge control circuit comprises at least one NMOS transistor.

23. The programmable current booster of claim 16 wherein each one switching stage rising edge output current regulation circuit includes at least one PMOS transistor.

24. The programmable current booster of claim 16 wherein each one switching stage falling edge output current regulation circuit includes at least one NMOS transistor.

25. The programmable current booster of claim 16 for use with a differential output driver of an integrated circuit device wherein the pair of differential output signals are further conditioned to conform to minimum and maximum limits for current and voltage as specified by a differential signaling standard.

26. A printed circuit board on which is mounted an integrated circuit device comprising a programmable current booster circuit for use with a differential output driver as defined in claim 16.

27. The programmable current booster of claim 16 for use with a differential output driver of an integrated circuit device wherein the pair of differential output signals conforms to at least one of the LVDS, HT or LVPECL signaling standards.

* * * * *